United States Patent [19]

Miller

[11] Patent Number: 5,099,481
[45] Date of Patent: Mar. 24, 1992

[54] REGISTERED RAM ARRAY WITH PARALLEL AND SERIAL INTERFACE

[75] Inventor: Michael J. Miller, Saratoga, Calif.

[73] Assignee: Integrated Device Technology, Inc., Santa Clara, Calif.

[21] Appl. No.: 317,001

[22] Filed: Feb. 28, 1989

[51] Int. Cl.$^5$ .................. G06F 11/00; G11C 29/00
[52] U.S. Cl. .................. 371/22.1; 395/425; 371/21.1
[58] Field of Search ... 364/200 MS File, 900 MS File; 371/22.1, 21.1

[56] References Cited

U.S. PATENT DOCUMENTS

| Re. 29,642 | 5/1978 | Kwiatkowski et al. | 364/900 |
|---|---|---|---|
| 4,159,535 | 6/1979 | Fuhrman | 364/900 |
| 4,194,243 | 3/1980 | Tsuda | 364/200 |
| 4,476,560 | 10/1984 | Miller et al. | 371/22.3 |
| 4,538,241 | 8/1985 | Levin et al. | 364/900 |
| 4,710,927 | 12/1987 | Miller | 371/22.1 |
| 4,935,929 | 6/1990 | Sidman et al. | 371/22.3 |

OTHER PUBLICATIONS

Advanced Micro Devices, Inc., "Am9151 1024×4 Registered Static RAM with SSR TM —On-Chip Diagnostics Capability", Publ. No. 05385, May 1986, pp. 4-23-8-4-250.

Primary Examiner—Eddie P. Chan
Assistant Examiner—Matthew C. Fagan
Attorney, Agent, or Firm—Thomas E. Schatzel

[57] ABSTRACT

A serial protocol register and an initialization counter are configured to initialize (program) a RAM array. The register is configured to receive, in serial format, an initial address to be loaded into the counter. Also, the register is configured to receive, in serial format, a series of machine states (data words), each to be stored in the RAM array. In addition, the register is configured to clock the counter following each received machine state. The counter is configured to develop a series of addresses, each for accessing the RAM array to store in the array a corresponding one of the machine states.

7 Claims, 3 Drawing Sheets

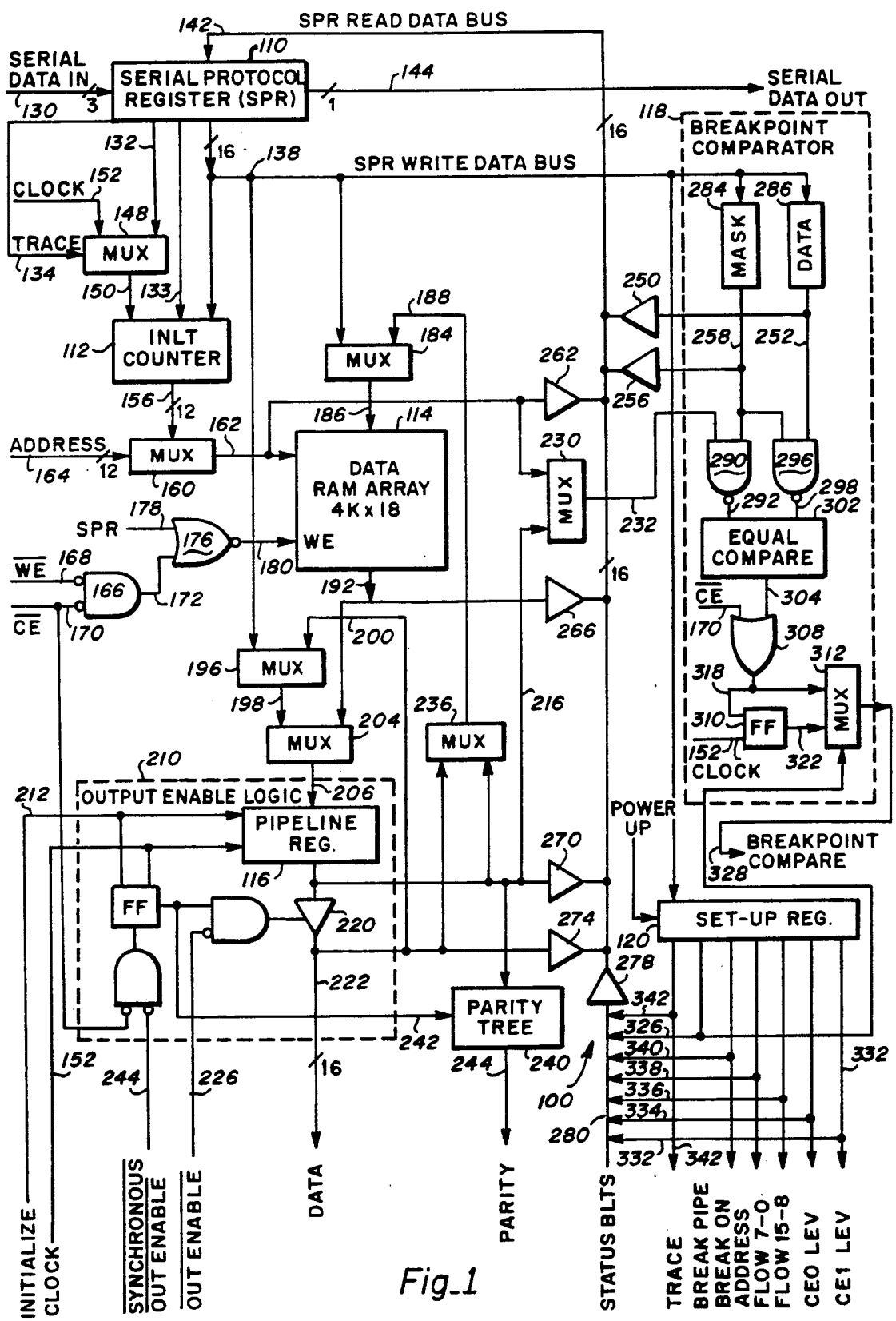
Fig_1

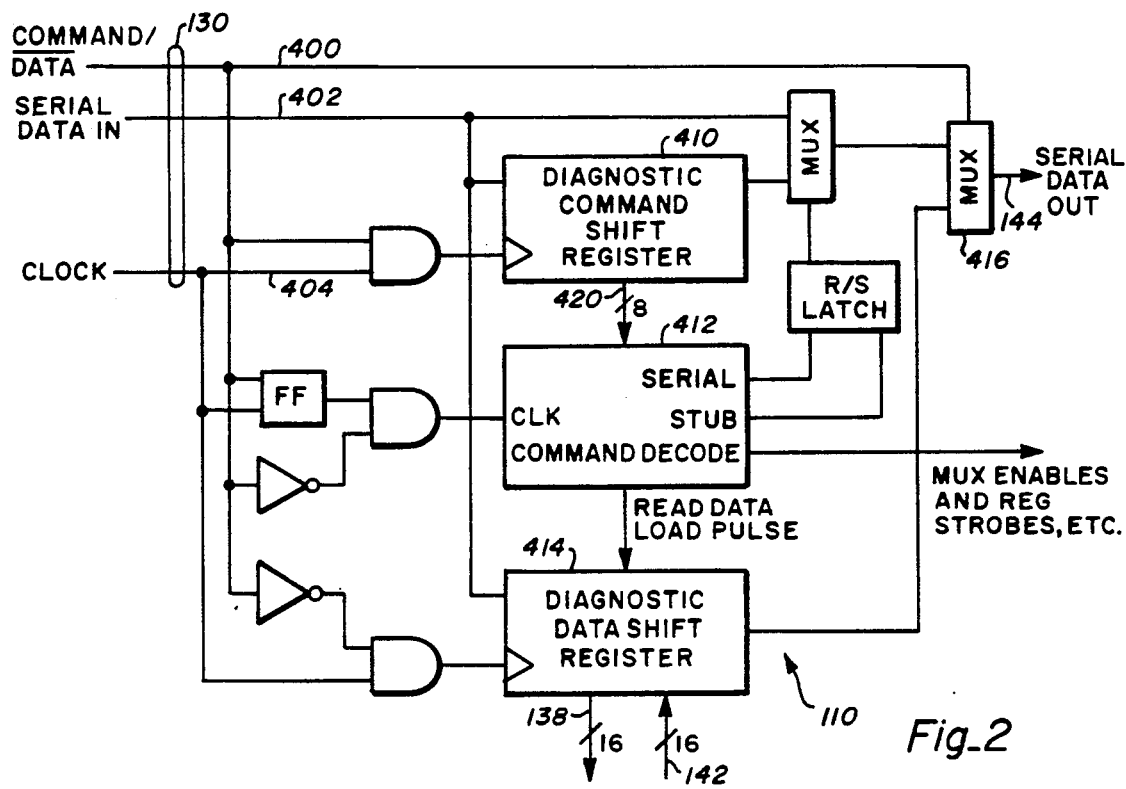
Fig_2
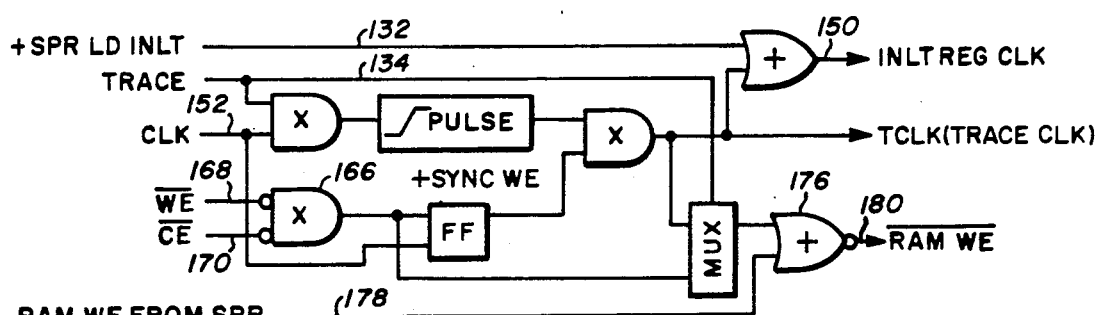
Fig_3
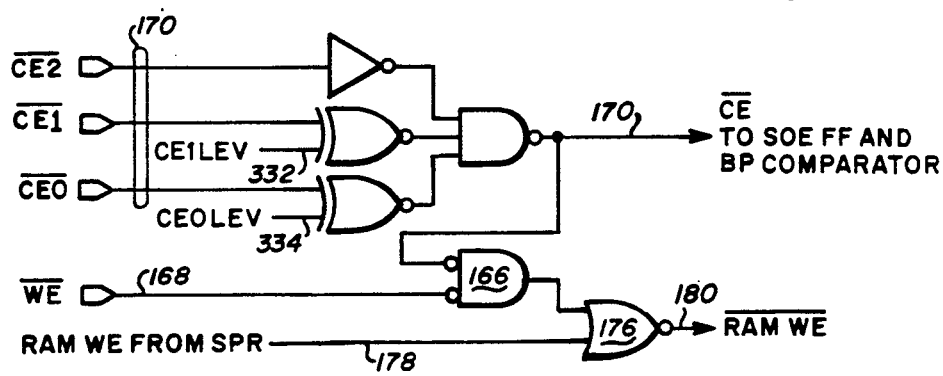
Fig_4

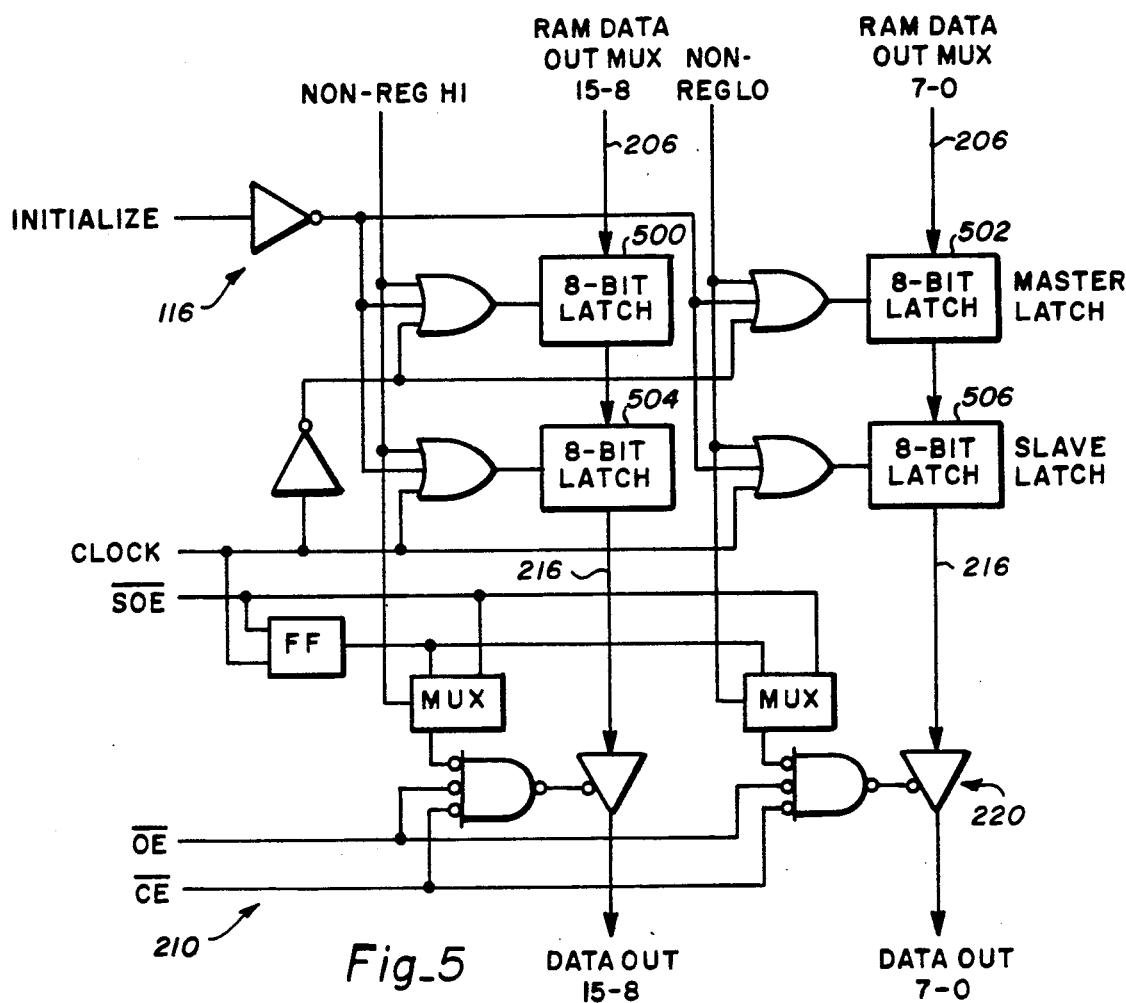
Fig_5
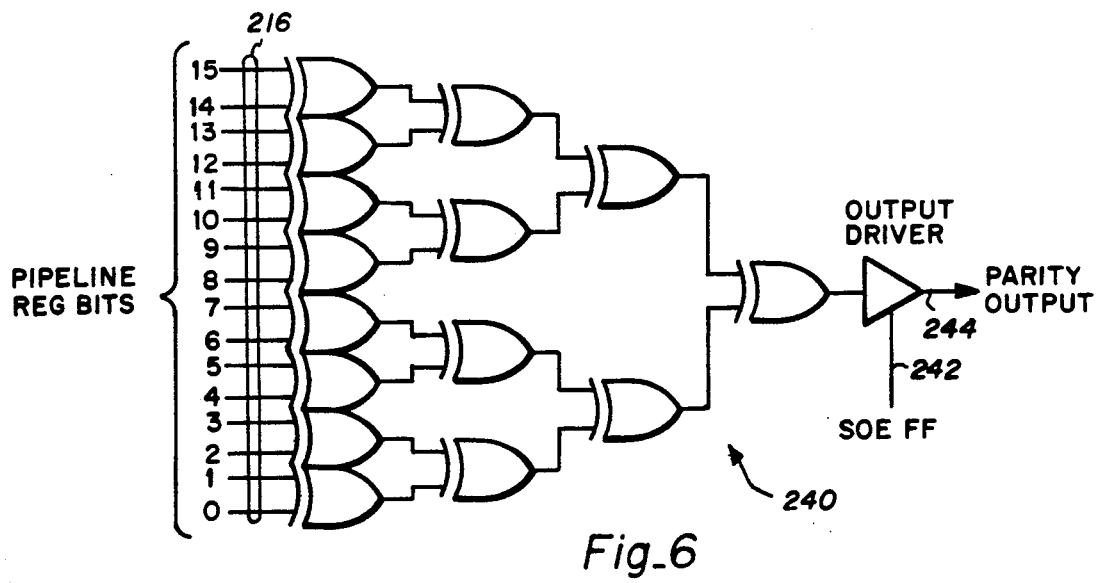
Fig_6

REGISTERED RAM ARRAY WITH PARALLEL AND SERIAL INTERFACE

TECHNICAL FIELD

The present invention relates to integrated circuit-type devices generally and more particularly to a serially loaded, registered RAM array.

BACKGROUND ART

In one arrangement, state machines employ a memory array driving a register. The memory array is programmed to contain machine states including a next machine state given a current machine state; and, the register is configured to hold the current machine state. Although, nonvolatile-type memory arrays are most commonly employed, volatile, static, random access memory (RAM) arrays are employed in some applications in which the contents of the memory array may need to be changed. However, to permit the contents of a RAM array to be changed has required that a relatively large number of array addressing lines and a relatively large number of array data (input) lines be connected to associated re-programming circuitry.

To simplify the inter connection of a state machine RAM array with associated re-programming circuitry, Advanced Micro Devices, Incorporated has developed a registered static RAM device which they designate Am9151. In addition to a static RAM array and a pipeline register, the Am9151 device employs a initialize register and a serially loaded serial diagnostic register. Unfortunately, however, to permit the contents of the RAM array of the Am9151 device to be changed still requires that the relatively large number of array addressing lines be connected to the associated re-programming circuitry.

DISCLOSURE OF THE INVENTION

It is therefore the primary object of the present invention to provide a registered RAM having means for simplified interconnection with associated RAM array re-programming circuitry.

Another object of the present invention is to provide a registered RAM having diagnostic means.

Yet another object of the present invention is to provide a registered RAM suitable for operation as a logic analyzer.

Briefly, the presently preferred embodiment of a registered RAM array in accordance with the present invention employs a serial protocol register, an initialization counter, a RAM array, and a pipeline register. The serial protocol register and initialization counter are configured to initialize (program) the RAM array. The register is configured to receive, in serial format, an initial address to be loaded into the counter. Also, the register is configured to receive, in serial format, a series of machine states (data words), each to be stored in the RAM array. In addition, the register is configured to clock the counter following each received machine state. The counter is configured to develop a series of addresses, each for the accessing RAM array to store in the array a corresponding one of the machine states.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a registered RAM array in accordance with the present invention;

FIG. 2 is a schematic diagram of the serial protocol register shown in FIG. 1;

FIG. 3 is a schematic diagram of trace mode clock logic circuitry of the registered RAM array shown in FIG. 1;

FIG. 4 is a schematic diagram of the chip enabling logic circuitry represented by gates shown in FIG. 1;

FIG. 5 is a schematic diagram of the output enable logic portion shown in FIG. 1; and FIG. 6 is a schematic diagram of the parity tree shown in FIG. 1.

BEST MODE FOR CARRYING OUT THE INVENTION

Illustrated in FIG. 1 of the drawing generally designated by the number 100 is the presently preferred embodiment of a registered, static, random access memory (RAM) array in accordance with the present invention. Registered RAM array 100 is shown to employ a serial protocol register 110, a twelve-bit initialization counter 112, a 4K by sixteen static RAM array 114, a pipeline register 116, a breakpoint comparator 118, and a set-up register 120. Serial protocol register 110 and initialization counter 112 are configured to initialize (program) RAM array 114. Register 110 is configured to receive, in serial format, an initial address to be loaded into counter 112. Also, register 110 is configured to receive, in serial format, a series of machine states (data words), each to be stored in RAM array 114. In addition, register 110 is configured to clock counter 112 following each received machine state. Counter 112 is configured to develop a series of addresses, each for accessing RAM array 114 to store in the array a corresponding one of the machine states.

More specifically, serial protocol register 110 is connected to a three line bus 130 to receive (on a serial data in line) a signal representing a serial bit stream that includes a command portion representing in serial format a number of commands and a data words portion representing in serial format a number of words of data (including the initial address to be loaded into initialization counter 112 and the machine states to be loaded into RAM array 114). Register 110 decodes some of the commands to develop registered RAM array 100 controlling signals, including an initialization counter 112 clocking signal on a line 132, a counter (112) loading signal on a line 133, and a normal/trace mode enabling signal on a line 134. Also, register 110 converts from serial to parallel format some of the data words to develop signals which the register develops on a sixteen line SPR (serial protocol register) write data bus 138. In addition, register 110 converts from parallel to serial format, data words represented by signals developed on a sixteen line SPR (serial protocol register) read data bus 142 to develop a signal on a serial data out line 144.

A multiplexer 148 is employed. The multiplexer is configured to develop on a line 150 a signal the state of which corresponds either to the state of a clocking signal externally developed on a line 152 or to the state of the initialization counter 112 clocking signal developed by serial protocol register 110 on line 132, as selected responsive to the state of the normal/trace mode signal developed by the register on line 134.

Initialization counter 112 is configured to be responsive to the state of the counter loading signal developed by serial protocol register 110 on line 133 and operative to load as a count the number represented by signals developed by the register on the twelve lowest order lines of the sixteen lines of bus 138. Also, counter 112 is configured to be responsive to changes in the state of the clocking signal developed on line 150 by multiplexer 148 and operative to increment the counter 112 count. In addition, counter 112 is operative to develop on a twelve line bus 156, signals, the state of which, represent the counter 112 count.

A multiplexer 160 is employed configured to develop on a twelve line bus 162, signals, the state of which, correspond either each to the state of a corresponding one of the counter 112 count signals developed on bus 156 or each to the state of a corresponding one of twelve address signals externally developed on a twelve line bus 164, as selected responsive to the state of a signal developed by serial protocol register 110.

A number of gates are employed, including gates represented by a two-input AND gate 166, configured with one of the two (negated) gate inputs connected to a line 168 to receive an externally developed (active-low) write enabling signal; with the other one of the two (negated) gate inputs connected to a bus 170 to receive a combination of externally developed chip enabling signals; and with the gate output connected to a line 172. Another gate is represented by a two-input NOR gate 176 configured with one of the two gate inputs connected to a line 178 to receive an enabling signal developed by serial protocol register 110; with the other one of the gate inputs coupled to gate 166 by line 172; and with the gate (176) output coupled to RAM array 114 by a line 180.

A multiplexer 184 is employed, configured to develop on a sixteen line bus 186, signals, the state of which, corresponds either each to the state of a corresponding one of the sixteen signals developed on SPR write data bus 138 by serial protocol register 110 or each to the state of a corresponding one of sixteen data signals developed on a sixteen line bus 188, as selected responsive to the state of a signal developed by the serial protocol register.

RAM array 114 is configured with a set of sixteen data inputs each connected to a corresponding line of the sixteen lines of bus 186; with a set of twelve address inputs connected each to a corresponding line of the twelve lines of bus 162; with a write enable input connected to line 180; and with a set of twelve data outputs each connected to the corresponding line of a sixteen line bus 192.

A pair of multiplexers are employed, including a multiplexer 196, configured to develop on a sixteen line bus 198, signals the state of which corresponds either each to the state of a corresponding one of the sixteen signals developed on SPR write data bus 138 by serial protocol register 110 or each to the state of a corresponding one of sixteen RAM data output signals developed on a sixteen line bus 200, as selected responsive to the state of a signal developed by the serial protocol register. The other multiplexer, a multiplexer 204, is configured to develop on a sixteen line bus 206, signals, the state of which, corresponds either each to the state of a corresponding one of the sixteen signals developed on bus 198 by multiplexer 196 or each to the state of a corresponding one of sixteen data output signals developed on the sixteen lines of bus 192 by RAM array 114, as selected responsive to the state of a signal developed by the serial protocol register.

Pipeline register 116, which forms a part of an output enable logic portion 210, is configured to be responsive to an (active-low) initializing signal developed on a line 212 by serial protocol register 110 and the clocking signal externally developed on line 152 and operative to store (latch) the state of each of the sixteen signals developed on bus 206 by multiplexer 204. In addition, register 116 is operative to develop, on a sixteen line bus 216, signals, each having a state which corresponds to that of a respective one of the stored states. Two pair of eight, tri-state, buffers, represented by a buffer 220, are employed, configured to develop on the sixteen lines of RAM data output bus 200, signals, the state of which, corresponds each to the state of a respective one of the sixteen signals developed on bus 216 by pipeline register 116, when enabled responsive to a number of signals, including the (active-low) chip enabling signal externally developed on line 170, an (active-low) synchronous output enable signal externally developed on a line 224, and an (active-low) output enabling signal externally developed on a line 226, as will become apparent shortly.

Another pair of multiplexers are employed, including a multiplexer 230, configured to develop on a sixteen line bus 232, signals, the state of which, corresponds either each to the state of a corresponding one of the twelve signals developed on bus 162 by multiplexer 160 (and four low logic level signals) or each to the state of a corresponding one of the signals developed on the sixteen lines bus 216 by pipeline register 116, as selected responsive to the state of a signal developed by the serial protocol register. The other multiplexer, a multiplexer 236, is configured to develop on the sixteen lines of bus 188, signals, the state of which, corresponds either each to the state of a corresponding one of the sixteen signals developed on bus 200 by the tri-state buffers represented by buffer 220 or each to the state of a corresponding one of the signals developed on the sixteen lines of bus 216 by pipeline register 116, again, as selected responsive to the state of a signal developed by the serial protocol register.

A parity tree 240 is employed, configured with a set of sixteen data inputs each connected to a corresponding line of the sixteen lines of bus 216; with an output enable input coupled to output enable logic portion 210 by a line 242; and with an output connected to a line 244.

To selectively couple signals to SPR read data bus 142 (and, thus, to serial protocol register 110), seven sets of sixteen, tri-state, buffers are employed. One set of sixteen, tri-state, buffers, represented by a buffer 250, are configured each with a data input connected to the corresponding line of a sixteen line bus 252; with an enable input connected to serial protocol register 110; and with a data output connected to the corresponding line of the sixteen lines of SPR read data bus 142. Another set of sixteen, tri-state, buffers, represented by a buffer 256, are configured each with a data input connected to the corresponding line of a sixteen line bus 258; with an enable input, similarly, connected to register 110; and with a data output, similarly, connected to the corresponding line of the sixteen lines of bus 142. Represented by a buffer 262, yet another set of sixteen, tri-state, buffers, are configured each with a data input connected to the corresponding line of the twelve lines of bus 162 (and four low logic level signals); with an enable input connected to register 110; and with a data output, similarly, connected to bus 142. Yet another set of sixteen, tri-state, buffers, represented by a buffer 266, are configured each with a data input connected to the corresponding line of the sixteen lines of bus 192; with an enable input connected to register 110; and with a data output connected to bus 142. A fifth set of sixteen, tri-state, buffers, represented by a buffer 270, are configured each with a data input connected to the corresponding line of the sixteen lines of bus 216; with an enable input connected to register 110; and with a data output connected to bus 142. Represented by a buffer 274, the sixth set of sixteen, tri-state, buffers, are configured each with a data input connected to the corresponding line of the sixteen lines of bus 200; with an enable input connected to register 110; and with a data output connected to bus 142. The final (seventh) set of sixteen, tri-state, buffers, represented by a buffer 278, are configured each with a data input connected to the corresponding line of a sixteen line status bit bus 280; with an enable input connected to register 110; and with a data output connected to bus 142.

Breakpoint comparator 118 includes a pair of sixteen-bit registers, including a mask register 284 and a data register 286. Mask register 284 is configured to be responsive to a clocking signal developed by serial protocol register 110 and operative to store (latch) the state of each of the sixteen signals developed on SPR write data bus 138 by register 110. In addition, register 284 is operative to develop on the sixteen lines of bus 258, signals, each having a state which corresponds to that of a respective one of the stored states. Similarly, data register 286 is configured to be responsive to a clocking signal developed by serial protocol register 110 and operative to store (latch) the state of each of the sixteen signals developed on SPR write data bus 138 by register 110. In addition, register 286 is operative to develop on the sixteen lines of bus 252, signals, each having a state which corresponds to that of a respective one of the stored states.

Also, breakpoint comparator 118 includes two sets of sixteen, two-input, NAND gates. One of the two sets of sixteen, NAND gates, represented by a gate 290, are configured with one of the two gate inputs of each of the gates connected to the respective one of the sixteen lines of bus 232; with the other one of the gate inputs of each of the gates connected to the respective one of the sixteen lines of bus 258; and with the gate output of each of the gates connected to the respective line of a sixteen line bus 292. The other one of the two sets of sixteen NAND gates, represented by a gate 296, are configured with one of the two gate inputs of each of the gates connected to the respective one of the sixteen lines of bus 258; with the other one of the gate inputs of each of the gates connected to the respective one of the sixteen lines of bus 252; and with the gate output of each of the gates connected to the respective line of a sixteen line bus 298.

In addition, breakpoint comparator 118 includes gates forming an equal comparator 302. The gates of equal comparator 302 are configured to compare the state of the signals developed on the sixteen lines of bus 292 each with the state of the corresponding one of the sixteen signals developed on bus 298. Further, the comparator 118 gates are configured to develop on a line 304 a signal the state of which indicates when the bus 292 signal states match the bus 298 signal states.

Finally, breakpoint comparator 118 includes a two-input, OR, gate 308, a D-type flip-flop 310, and a multiplexer 312. Gate 308 is configured with one of the two gate inputs connected to line 304; with the other one of the two gate inputs connected to line 170 to receive the externally developed (active-low) chip enabling signal; and with the gate output coupled to flip-flop 310 by a line 318. Flip-flop 310 is configured with the flip-flop data input connected to line 318; with the flip-flop clock input connected to line 152 to receive the externally developed clocking signal; and with the flip-flop data output coupled to multiplexer 312 by a line 322. Multiplexer 312 is configured with a first data input connected to line 318; with a second data input connected to line 322; with a select input connected to a line 326; and with a data output connected to a line 328.

Set-up register 120 is configured to be responsive to a clocking signal developed by serial protocol register 110 and operative to store (latch) the state of seven of the sixteen signals developed on SPR write data bus 138 by register 110. In addition, register 284 is operative to develop on seven of the sixteen lines of bus 280, registered RAM array 100 controlling, status-bit signals each having a state which corresponds to that of a respective one of the (seven) stored states. Developed is a first, chip enabling, active state (high/low) selecting signal (CE 1) on a line 332; a second, chip enabling, active state (high/low) selecting signal (CE 2) on a line 334; a pipeline register 116, bits 15-8, flow through enabling signal on a line 336; a pipeline register 116, bits 7-0, flow through enabling signal on a line 338; a break on address/pipeline-register-output controlling signal on a line 340; the breakpoint comparator 118 multiplexer 312 selecting signal on line 326; and a trace mode controlling signal on a line 342.

The format of the set-up register 120 developed signals and the other signals developed on bus 280 is as follows:

| Bit | Name | Type | Function |
| --- | --- | --- | --- |
| 15 | CE | RO | Chip enable (OR of all chip enable pins) (178) |
| 14 | SOE FF | RO | Synchronous output enable FF (210) |
| 13 | SOP Pin | RO | Synchronous output enable pin (224) |
| 12 | OE Pin | RO | Output enable pin (224) |
| 11 | WE Pin | RO | Write enable pin (168) |
| 10 | init. Pin | RO | Initialize pin (212) |
| 9 | BP Com. | RO | Breakpoint comparator output (304) |
| 8 | BP Pin | RO | Breakpoint output pin (328) |
| 7 | CE 1 | R/W | Chip enable (178) active state: 1 = active high/0 = active low |
| 6 | CE 2 | R/W | Chip enable (178) active state: 1 = active high/0 = active low |
| 5 | Non-reg high | R/W | Set pipeline reg. (116) bits 15-8 for flow-through (non-registered) |
| 4 | Non-reg high | R/W | Set pipeline reg. (116) bits 7-0 for flow-through (non-registered) |
| 3 | — | — | — |
| 2 | BC RAM | R/W | 0 = breakpoint compare on pipeline register outputs 1 = breakpoint compare on RAM address inputs (230) |
| 1 | Break Pipe | R/W | Set breakpoint mux. (312) for pipeline FF output |
| 0 | Trace | R/W | Set up for trace mode: Y15-0 to pipeline reg., pipeline reg. to RAM, write with clock pulse, initialize counter as address, and increment counter after write |

Following reset, the multiplexer and bus gate default conditions are as follows:

| Default Conditions | |
|---|---|
| RAM address mux. (160) | Address pins (164) |
| RAM data in muxs. (184) | External data pins (222) |
| Pipeline input muxs. (204) | RAM data out (192) |
| Bus drivers (220) | Reg. source decode (from SPR) |

Bus 130 and serial protocol register 110 are further illustrated in FIG. 2. Bus 130 is shown to include a command/data line 400; the serial data in line, which is designated 402; and a clock line 404. As previously indicated, externally developed on the serial data in line (402) is a signal representing a serial bit stream that includes a command portion representing in serial format a number of commands and a data words portion representing in serial format a number of words of data. Each of the bits of the serial bit stream (externally developed on line 402) is delineated by a clocking signal externally developed on line 404. Each of the commands to be executed are delineated by a command-/data signal externally developed on line 400, as will become apparent shortly.

Serial protocol register 110 is shown to include an eight-bit, diagnostic command shift register 410; a command decode circuit 412; a sixteen-bit, diagnostic data shift register 414; a multiplexer 416; and a number of associated gates, flip-flops, and multiplexers. Diagnostic command shift register 410 is configured with a data input connected to line 402 to receive the serial bit stream. To clock into the register that portion of the serial bit stream which represents a command to be executed, register 410 is configured with a clock input coupled by a gate to lines 400 and 404 to receive the clocking signal developed on line 404 when the command/data signal developed on line 400 has a high logic potential level. In addition, register 410 is configured to convert from serial to parallel format the received command bits and to develop on an eight line bus 420, signals representing the converted bits. Finally, register 410 is configured to develop on line 144, a signal representing the command portion of the serial bit stream, delayed eight clock cycles.

Command decode circuit 412 is configured to receive, decode, and execute the commands represented by the converted bit signals developed on bus 420 by diagnostic command shift register 410. Following each (high-to-low) transition of the command/data signal developed on line 400, circuit 412 decodes the command represented by the bus 420 signals and develops signals on a bus 424 for controlling registered RAM array 100.

The following serial diagnostic register commands (operation codes and operands) are used:

| Command Code | Read/Write Function | Action | Notes |
|---|---|---|---|
| 0 | Read | Read register | Uses reg. select field |
| 1 | Write | Write register | Uses reg. select field |
| 2 | Read | Read reg. and incr. counter | Used for reading RAM |
| 3 | Write | Write reg. and incr. counter | Used for writing RAM |
| 4-C | — | Reserved (no-op) | |
| D | Write | Stub diagnostic | Broadcast |
| E | Write | Serial diagnostic commands | Serial commands |
| F | — | No-op | Guaranteed no-op |

| Register Code | Read/Write Function | Register | Notes |
|---|---|---|---|
| 0 | R/W | Init. counter | |
| 1 | R/W | RAM output | |
| 2 | R/W | Pipeline reg. | |
| 3 | R/W | Break mask reg. | |
| 4 | R/W | Break data reg. | |
| 5 | R/W | Set-up + status reg. | Break mux, trace mode, etc. |
| 6 | Read only | Y15-Y0 (data pins) | Data pins of chip |
| 7 | Read only | RAM address | Address going into RAM |
| 8-F | — | Reserved (no-op) | |

The following serial diagnostic register commands assignments are used:

| Reg. Sel. | Cmnd. | Source or Destination | Data Path |
|---|---|---|---|
| 0 | Read | Init. counter | Cntr. to RAM (160), RAM addrs. to bus (262) |
| 1 | Read | RAM output | Cntr. to RAM (160), RAM data to bus (266) |
| 2 | Read | Pipeline reg. | Pipeline register to bus (270) |
| 3 | Read | Break mask reg. | Mask reg. to bus (256) |
| 4 | Read | Break data reg. | Data reg. to bus (250) |
| 5 | Read | Set-up reg. | Set-up reg. to bus (278) |
| 6 | Read | Data pins | Data pins to bus (274) |
| 7 | Read | RAM address | Address mux. to bus (262) |
| 8-F | Read | None | — |
| 0 | Write | Init. counter | Load init. counter (112) |
| 1 | Write | RAM | Init. to RAM, RAM write (184) |
| 2 | Write | Pipeline reg. | Write bus to PL reg. clock reg. (196 & 204) |
| 3 | Write | Break mask reg. | Clock mask reg. (284) |
| 4 | Write | Break data reg. | Clock data reg. (286) |
| 5 | Write | Set-up reg. | Clock set-up latches, BP select latches (120) |
| 6-F | Write | None | — |
| Initialize pin active | | | RAM addrs. mux. to init. cntr., pipeline reg. transparent |
| Trace mode | | | Data I/O pins to PL reg. inputs PL reg. outputs to RAM data inputs RAM address mux. to init. counter enable increment Init. cntr. clock from PL reg. clock RAM write from PL reg. clock |

Diagnostic data shift register 414 is configured with a data input connected to line 402 to receive the serial bit stream. Also, register 414 is configured with a clock input coupled by a gate and an inverter to lines 400 and 404 to receive the clocking signal developed on line 404 when the command/data signal developed on line 400 has a low logic potential level to clock into the register that portion of the serial bit stream which represents a word of data. In addition, register 414 is configured to convert from serial to parallel format the received data word bits and to develop on the sixteen lines of bus 138, signals representing the converted bits. Further, register 414 is configured to receive data words represented by signals developed on bus 142 and to convert from parallel to serial format the received data words. Finally, register 410 is configured to develop on line 144, a signal representing, as a series of bits, the converted words.

Multiplexer 416 is configured with a first data input coupled to diagnostic command shift register 410 to receive the command portion serial bit stream; a second data input connected to diagnostic data shift register 414 to receive the converted word serial bit signal; a select (control) input connected to line 400 to receive the command/data signal; and with a data output connected to line 144.

For a further description of serial protocol register 110 the reader is referred to my U.S. No. 4,710,927 entitled Diagnostic Circuit.

The trace mode logic circuitry is illustrated in detail in FIG. 3; and, in FIG. 4, the chip enabling logic circuitry represented by gates 166 and 176 is illustrated.

Output enable logic portion 210 is illustrated in detail in FIG. 5. Pipeline register 116 is shown to include two pair of eight-bit latches, including a pair of latches respectively designated 500 and 502 and a pair of latches respectively designated 504 and 506. The latches (500, 502, 504, and 506) and some associated gates are configured to, under control of serial protocol register 110 (shown in FIG. under control of serial protocol register 110 (shown in FIG. 1), operate in a transparent mode. In the transparent mode, the latches (500, 502, 504, and 506) develop on bus 216, signals the state of each of which are the same as (follow) the state of the corresponding one of the signals developed on bus 206

Finally, parity tree 240 is illustrated in detail in FIG. 5.

Operationally, in an initialization mode, registered RAM array 100 (illustrated in FIG. 1) operates as follows. Serial protocol register 110 and initialization counter 112 initialize (program) RAM array 114. Register 110 receives, in serial format, an initial address, which is loaded into counter 112. Also, register 110 receives, in serial format, a series of machine states (data words), each of which is stored in RAM array 114. In addition, register 110 clocks counter 112 following each received machine state. Counter 112 develops a series of addresses, each accessing RAM array 114, to store in the array a corresponding one of the machine states.

In addition, in the initialization mode, serial protocol register 110 receives, in serial format, a mask, which is loaded into mask register 284 of breakpoint comparator 118. Further, serial protocol register 110 receives, in serial format, either a breakpoint address or a breakpoint machine state, which is loaded into data register 286 of breakpoint comparator 118.

In another mode, serial protocol register 110 converts from parallel to serial format, data words represented by signals developed on SPR read data bus 142 including RAM array addresses (from bus 162), stored machine state data words (from bus 192), and latched state machine state data words (from bus 216 or bus 200), to develop the serial data out signal on line 144.

In a normal mode, registered RAM array 100 operates as part of a state machine. Responsive to an address, represented by signals externally developed on address bus 164, RAM array 114 develops, on bus 192, signals representing the machine state stored at the addressed location. Pipeline register 116 latches the state of the machine state signals; and, buffer 220 develop signals of similar state on data bus 200.

When the (masked portion of the) address, represented by the signals externally developed on address bus 164, is the same as the (masked portion of the) breakpoint address, stored in data register 286, or the (masked portion of the) machine state, represented by signals developed on bus 216, is the same as the (masked portion of the) breakpoint machine state, stored in data register 286, breakpoint comparator 118 develops a signal of active state on line 328.

When serial protocol register 110 receives, in serial format, a trace command, registered RAM array 100 enters a trace mode. In this mode, trace words (data), represented by signals externally developed on data bus 200, are written into RAM array 114. First, each trace word is, temporarily, written into pipeline register 116 by the line 152 clock signal. Next, the trace word stored in pipeline register 116 is written into RAM array 114 at the address represented by the signals developed by counter 112. Then, counter 112 is clocked.

In the presently preferred embodiment, the various components of registered RAM 100 are all integrated into a single device using CMOS technology.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A registered RAM system for receiving an externally generated serial bit stream signal that includes both a command portion representing in serial format a command and a data words portion representing in serial format both an initial address and a plurality of machine states, for receiving an externally generated plurality of signals representing a first series of RAM array addresses, for receiving an externally generated serial bit stream clocking signal, and for receiving an externally generated command/data signal, said registered RAM system comprising in combination:

a serial protocol register for receiving the serial bit stream signal, for converting from serial to parallel format the command, the initial address, and at least some of said machine states, for developing a plurality of signals representing the parallel format initial address and parallel format machine states, for developing a first counter clocking signal, and for developing a counter loading signal, said serial protocol register including, first coupling means, a command register having a clock input coupled by said first coupling means to receive the serial bit stream clocking signal, a serial data input coupled to receive the command portion of said serial bit stream signal, and a predetermined number of parallel data outputs at which said command register develops a plurality of signals representing said parallel format command, a command decoder having a predetermined number of parallel data inputs coupled to said command register to receive at least a predetermined number of said parallel format command signals, said command decoder for developing said counter loading signal, second coupling means, a data register having a clock input coupled by said second coupling means to receive said serial bit stream clocking signal, a serial data input coupled to receive the data words portion of said serial bit stream signal, and a predetermined number of parallel data outputs at which said data register develops a plurality of signals representing said parallel format initial address and said parallel format machine states, an initialization counter connected to said serial protocol register to receive said counter loading signal and to receive said parallel format initial address signals at a time delineated by said counter loading signal and coupled to said serial protocol register to receive said first counter clocking signal, said initialization counter being clocked by said first counter clocking signal to develop a plurality of signals representing a second series of RAM array addresses;

a first multiplexer including a first set of data inputs to receive the first series of RAM array addresses signals, a second set of data inputs connected to said initialization counter to receive said second series of RAM array addresses signals, and a set of data outputs at which said first multiplexer develops a plurality of signals representing a selected one of said first and said second series of RAM array addresses signals;

a RAM array including a plurality of storage locations, said RAM array coupled to said first multiplexer to receive said selected one of first and second series of RAM array addresses signals and coupled to said serial protocol register to receive said parallel format machine states signals, said RAM array for storing said parallel format machine states each at a respective one of said storage locations addressed by a respective one of said second series of RAM array addresses to initialize said RAM array, for retrieving at least some of the stored machine states each stored at one of said storage locations addressed by a respective one of said first series of RAM array addresses, and for developing a plurality of signals representing the retrieved machine states; and a pipeline register coupled to said RAM array to receive said retrieved machine states signals, for latching the state of each of said retrieved machine states, and for developing a plurality of signals representing the latched machine states.

2. The registered RAM system as recited in claim 1 for further receiving an externally generated second counter clocking signal and externally generated signals representing trace words, wherein said registered RAM system further comprises a second multiplexer including a first data input connected to said serial protocol register to receive said first counter clocking signal, a second data input to receive said second counter clocking signal, and a data output connected to said initialization counter, said second multiplexer developing at said data output a signal representing a selected one of said first and said second counter clocking sigals, and wherein said initialization counter is further clocked by said second counter clocking signal, and wherein said RAM array further stores at least some of said trace words each at a one of said storage locations addressed by a respective one of said second series of RAM array addresses.

3. The registered RAM system as recited in claim 1 wherein said serial bit stream signal data words portion further include at least one breakpoint address, wherein said serial protocol register further converts from serial to parallel format said received breakpoint address, wherein said data register develops said plurality of signals so as to further represent said parallel format breakpoint address, and wherein said registered RAM system further comprises a breakpoint comparator connected to said serial protocol register to receive said parallel format breakpoint address signals and connected to said first multiplexer to receive said first series of RAM array addresses, said breakpoint comparator for developing a signal which indicates when one of said first series of RAM array addresses is the same as said breakpoint address.

4. The registered RAM system as recited in claim 1 wherein said serial bit stream signal data words portion further include at least one breakpoint machine state, wherein said serial protocol register further converts from serial to parallel format said received breakpoint machine state wherein said data register develops said plurality of signals so as to further represent said parallel format breakpont machine state, and wherein said registered RAM system further comprises a breakpoint comparator connected to said serial protocol register to receive said parallel format breakpoint machine state signals and connected to said RAM array to receive said retrieved machine states signals, said breakpoint comparator for developing a signal which indicates when one of said retrieved machine states is the same as said breakpoint machine state.

5. A registered RAM system for receiving an externally generated serial bit stream signal that includes both a command portion representing in serial format a command and a data words portion representing in serial format both an initial address and a plurality of machine states, for receiving an externally generated plurality of signals representing a first series of RAM array addresses, for receiving an externally generated serial bit stream clocking signal, and for receiving an externally generated command/data signal, said registered RAM system comprising in combination:

a serial protocol register for receiving the serial bit stream signal, for converting from serial to parallel format the command, the initial address, and at least some of said machine states, for developing a plurality of signals representing the parallel format initial address and parallel format machine states, for developing a first counter clocking signal, and for developing a counter loading signal, said serial protocol register including, first coupling means, a command register having a clock input coupled by said first coupled means to receive the serial bit stream clocking signal, a serial data input coupled to receive the command portion of said serial bit stream signal, a serial data output at which said command register develops a signal representing said command portion of said serial bit stream signal delayed a predetermined number of cycles of said serial bit stream signal clocking signal, and a predetermined number of parallel data outputs at which said command register develops a plurality of signals representing said parallel format command, a command decoder having a predetermined number of parallel data inputs coupled to said command register to receive at least a predetermined number of said parallel format command signals, said command decoder for developing said counter loading signal, second coupling means, a data register having a clock input coupled by said second coupling means to receive said serial bit stream clocking signal, a serial data input coupled to receive the data words portion of said serial bit stream signal, a serial data output at which said data register develops a signal representing at least a portion of said data word portion of said serial bit stream signal delayed a predetermined number of cycles of said serial bit stream signal clocking signal, and a predetermined number of parallel data outputs at which said data register develops a plurality of signals representing said parallel format initial address and said parallel format machine states, third coupling means, and a first multiplexer having a first data input coupled by said third coupling means to said command register serial data output to receive said delayed command portion signal, a second input coupled to said data register serial data output to receive said dealyed data word portion signal, a control input coupled to receive the command/data signal, and a data output at which said first multiplexer develops a delayed serial bit stream signal representing a combination of at least said delayed command portion and said delayed data word portion;

an initialization counter connected to said serial protocol register to receive said counter loading signal and to receive said parallel format initial address signals at a time delineated by said counter loading signal and coupled to said serial protocol register to receive said first counter clocking signal, said intialization counter being clocked by said first counter clocking signal to develop a plurality of signals representing a second series of RAM array addresses;

a second multiplexer including a first set of data inputs to receive the first series of RAM array addresses signals, a second set of data inputs connected to said initialization counter to receive said second series of RAM array addresses signals, and a set of data outputs at which said second multiplexer develops a plurality of signals repersenting a selected one of said first and said second series of RAM array addresses signals;

a RAM array including a plurality of storage locations, said RAM array coupled to said second multiplexer to receive said selected one of said first and second series of RAM array addresses signals and coupled to said serial protocol register to receive said parallel format machine states signals, said RAM array for storing said parallel format machine states each at a respective one of said storage locations addressed by a respective one of said second series of RAM array addresses to initialize said RAM array, for retrieving at least some of the stored machine states each stored at one of said storage locations addressed by a respective one of said first series of RAM array addresses, and for developing a plurality of signals representing the retrieved machine states;

a pipeline register coupled to said RAM array to receive said retrieved machine states signals, for latching the state of each of said retrieved machine states, and for developing a plurality of signals representing the latched machine states; and fourth coupling means connected to said data register of said serial protocol register and to said second multiplexer, said fourth coupling means for selectively coupling to said data register of said serial protocol register at least some of said selected one of said first and second series of RAM array addresses signals, wherein said serial protocol register develops therefrom at least one serial format data word, and wherein said serial protocol register develops said delayed serial bit stream signal to further represent said serial format data word.

6. A registered RAM system for receiving an externally generated serial bit stream signal that includes both a command portion representing in serial format a command and a data words portion representing in serial format both an initial address and a plurality of machine states, for receiving an externally generated plurality of singals representing a first series of RAM array addresses, for receiving an externally generated serial bit stream clocking signal, and for receiving an externally generated command/data signal, said registered RAM system comprising in combination:

a serial protocol register for receiving the serial bit stream signal, for converting from serial to parallel format the command, the initial address, and at least some of said machine states, for developing a plurality of signals representing the parallel format initial address and parallel format machine states, for developing a first counter clocking signal, and for developing a counter loading signal, said serial protocol register including, first coupling means, a command register having a clock input coupled by said first coupling means to receive the serial bit stream clocking signal, a serial data input coupled to receive the command portion of said serial bit stream signal, a serial data output at which said command register develops a signal representing said command portion of said serial bit stream signal delayed a predetermined number of cycles of said serial bit stream signal clocking signal, and a predetermined number of parallel data outputs at which said command register develops a plurality of signals representing said parallel format command, a commamnd decoder having a predetermined number of parallel data inputs coupled to said command register to receive at least a predetermined number of said parallel format command signals, said command decoder for developing said counter loading signal, second coupling means, a data register having a clock input coupled by said second coupling means to receive said serial bit stream clocking signal, a serial data input coupled to receive the data words portion of said serial bit stream signal, a serial data output at which said data register develops a signal representing at least a portion of said data word portion of said serial bit stream signal delayed a predetermined number of cycles of said serial bit stream signal clocking singal, and a predetermined number of parallel data outputs at which said data register develops a plurality of signals representing said parallel format initial address and said parallel format machine states, third coupling means, and a first multiplexer having a first data input coupled by said third coupling means to said command register serial data output to receive said delayed command portion signal, a second input coupled to said data register serial data output to receive said delayed data word portion signal, a control input coupled to receive the command/data signal, and a data output at which said first multiplexer develops a delayed serial bit stream signal representing a combination of at least said delayed command portion and said delayed data word portion;

an initialization counter connected to said serial protocol register to receive said counter loading signal and to receive said parallel format initial address signals at a time delineated by said counter loading signal and coupled to said serial protocol register to receive said first counter clocking signal, said initialization counter being clocked by said first counter clocking signal to develop a plurality of signals representing a second series of RAM array addresses;

a second multiplexer including a first set of data inputs to receive the first series of RAM array addresses signals, a second set of data inputs connected to said initialization counter to receive said second series of RAM array addresses signals, and a set of data outputs at which said second multiplexer develops a plurality of signals representing a selected one of said first and said second series or RAM array addresses signals;

a RAM array including a plurality of storage locations, said RAM array coupled to said second multiplexer to receive said selected one of said first and second series of RAM array addresses signals and coupled to said serial protocol register to receive said parallel format machine states signals, said RAM array for storing said parallel format machine states each at a respective one of said storage locations addressed by a respective one of said second series of RAM array addresses to initialize said RAM array, for retrieving at least some of the stored machine states each stored at one of said storage locations addressed by a respective one of said first series of RAM array addresses, and for developing a plurality of signals representing the retrieved machine states;

a pipeline register coupled to said RAM array to receive said retrieved machine states signals, for latching the state of each of said retrieved machine states, and for developing a plurality of signals representing the latched machine states; and fourth coupling means connected to said data register of said serial protocol register and to said RAM array, said fourth coupling means for selectively coupling to said data register of said serial protocol register at least some of said retrieved machine states signals, wherein said serial protocol register develops therefrom at least one serial format data word, and wherein said serial protocol register develops said delayed serial bit stream signal to further represent said serial format data word.

7. A registered RAM system for receiving an externally generated serial bit stream signal that includes both a command portion representing in serial format a command and a data words portion representing in serial format both an initial address and a plurality of machine states, for receiving an externally generated plurality of signals representing a first series of RAM array addresses, for receiving an externally generated serial bit stream clocking signal, and for receiving an externally generated command/data signal, said registered RAM system comprising in combination:

a serial protocol register for receiving the serial bit stream signal, for converting from serial to parallel format the command, the initial address, and at least some of said machine states, for developing a plurality of signals representing the parallel format initial address and parallel format machine states, for developing a first counter clocking signal, and for developing a counter loading signal, said serial protocol register including, first coupling means, a command register having a clock input coupled by said first coupling means to receive the serial bit stream clocking signal, a serial data input coupled to receive the command portion of said serial bit stream signal, a serial data output at which said command register develops a signal representing said command portion of said serial bit stream signal delayed a predetermined number of cycles of said serial bit stream signal clocking signal, and a predetermined number of parallel data outputs at which said command register develops a plurality of signals representing said parallel format command, a command decoder having a predetermined number of parallel data inputs coupled to said command register to receive at least a predetermined number of said parallel format command signals, said command decoder for developing said counter loading signal, second coupling means, a data register having a clock input coupled by said second coupling means to receive said serial bit stream clocking signal, a serial data input coupled to receive the data words portion of said serial bit stream signal, a serial data output at which said data register develops a signal representing at least a portion of said data word portion of said serial bit stream signal delayed a predetermined number of cycles of said serial bit stream signal clocking signal, and a predetermined number of parallel data outputs at which said data register develops a plurality of signals representing said parallel format initial address and said parallel format machine states, third coupling means, and a first multiplexer having a first data input coupled by said third coupling means to said command register serial data output to receive said delayed command portion signal, a second input coupled to said data register serial data output to receive said delayed data word portion signal, a control input coupled to receive the command/data signal, and a data output at which said first multiplexer develops a delayed serial bit stream signal representing a combination of at least said delayed command portion and said delayed data word portion; p1 an initialization counter connected to said serial protocol register to receive said counter loading signal and to receive said parallel format initial address signals at a time delineated by said counter loading signal and coupled to said serial protocol register to receive said first counter clocking signal, said initialization counter being clocked said first counter clocking signal to develop a plurality of signals representing a second series of RAM array addresses;

a second multiplexer including a first set of data inputs to receive the first series of RAM array addresses signals, a second set of data inputs connected to said initialization counter to receive said second series of RAM array addresses signals, and a set of data outputs at which said second multiplexer develops a plurality of signals representing a selected one of said first and said second series of RAM array addresses signals;

a RAM array including a plurality of storage locations, said RAM array coupled to said second multiplexer to receive said selected one of said first and second series of RAM array addresses signals and coupled to said serial protocol register to receive said parallel format machine states signals, said RAM array for storing said parallel format machine states each at a respective one of said storage locations addressed by a respective one of said second series of RAM array addresses to initialize said RAM array, for retrieving at least some of the stored machine states each stored at one of said storage locations addressed by a respective one of said first series of RAM array addresses, and for developing a pluralilty of signals representing the retrieved machine states;

a pipeline register coupled to said RAM array to receive said retrieved machine states signals, for latching the state of each of said retrieved, machine states, and for developing a plurality of signals representing the latched machine states; and fourth coupling means connected to said data register of said serial protocol register and to said pipeline register, said fourth coupling means for selectively coupling to said data register of said serial protocol register at least some of said latched machine states signals, wherein said serial protocol register develops therefrom at least one serial format data word, and wherein said serial protocol register develops said delayed serial bit stream signal to further represent said serial format data word.

* * * * *